(12) United States Patent
Hong et al.

(10) Patent No.: US 7,880,653 B2
(45) Date of Patent: Feb. 1, 2011

(54) SWITCHED-CAPACITOR CIRCUITS, INTEGRATION SYSTEMS, AND METHODS OF OPERATION THEREOF

(75) Inventors: Merit Y. Hong, Chandler, AZ (US); Mohammad Nizam U. Kabir, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 139 days.

(21) Appl. No.: 12/363,201

(22) Filed: Jan. 30, 2009

(65) Prior Publication Data

US 2010/0194612 A1 Aug. 5, 2010

(51) Int. Cl.
*H03M 3/00* (2006.01)
(52) U.S. Cl. ........................ 341/143; 341/144
(58) Field of Classification Search ................. 341/143, 341/144, 145, 156
See application file for complete search history.

(56) References Cited

U.S. PATENT DOCUMENTS

| | | | |
|---|---|---|---|
| 5,243,345 A | 9/1993 | Naus et al. | |
| 5,563,597 A * | 10/1996 | McCartney | ................. 341/150 |
| 6,040,793 A | 3/2000 | Ferguson, Jr. et al. | |
| 6,441,762 B2 | 8/2002 | Angelici et al. | |
| 6,556,075 B1 | 4/2003 | Jordan | |
| 6,570,519 B1 | 5/2003 | Yang | |
| 6,621,438 B1 | 9/2003 | Hong | |
| 6,744,394 B2 | 6/2004 | Liu et al. | |
| 6,825,717 B2 | 11/2004 | Dettman | |
| 7,068,198 B2 | 6/2006 | Hong et al. | |
| 7,136,006 B2 | 11/2006 | Koh et al. | |
| 7,167,119 B1 | 1/2007 | Lei et al. | |
| 7,262,655 B2 | 8/2007 | Mijuskovic | |
| 7,323,931 B2 | 1/2008 | Hong et al. | |
| 7,515,079 B2 * | 4/2009 | Maeda et al. | ................ 341/143 |
| 7,679,540 B2 * | 3/2010 | Ceballos et al. | ............. 341/150 |
| 2005/0275580 A1 | 12/2005 | Hong et al. | |

OTHER PUBLICATIONS

Hurst, P., et al., Double Sampling in Switched-Capacitor Delta-Sigma A/D Converters, IEEE Aug. 1990.
O'Connell, I., et al., A Novel Double Sampled Chopper Stabilised Intergrator for Switched Capacitor Sigma-Delta Modulators, IEEE, Jul. 2002.

(Continued)

*Primary Examiner*—Brian Young
(74) *Attorney, Agent, or Firm*—Ingrassia Fisher & Lorenz, P.C.

(57) ABSTRACT

Embodiments include integrator systems, switched-capacitor circuits, and methods of their operation. An integrator system comprises a differential amplifier and first and second sampling modules. The first sampling module includes a first capacitor and a first set of switches. The first set of switches changes a connection status between the first capacitor and first and second amplifier input terminals when a change in a polarity of a differential input signal does not occur between consecutive switching cycles, and refrains from changing the connection status when the change in the polarity does occur. The second sampling module includes a second capacitor and a second set of switches. The second set of switches changes a connection status between the second capacitor and the first and second amplifier input terminals when the change in the polarity does occur, and refrains from changing the connection status when the change in the polarity does not occur.

24 Claims, 9 Drawing Sheets

OTHER PUBLICATIONS

Park, S., et al., A Digitial-to-Analog Converter Based on Differential-Quad Switching, IEEE Journal of Solid-State Circuits, vol. 37, No. 10, Oct. 2002.

Schafferer, B., et al., A 3V CMOS 400mW 14b 1.GS/s DAC for Multi-Carrier Applications, ISSCC 2004/ Sessio 20/ Digitial-to-Analog COnverters, 20.1, 2004 IEEE International Solid-State Circuits Conference, Jun. 2004.

Senderowicz, D., et al., Low-Voltage Double Sampled Sigma-Delta Converters, IEEE Journal of Solid-State Circuits, vol. 32, No. 12, Dec. 1997.

\* cited by examiner

400    FIG.4

SWITCHED-CAPACITOR CIRCUITS, INTEGRATION SYSTEMS, AND METHODS OF OPERATION THEREOF

TECHNICAL FIELD

Embodiments of the inventive subject matter relate to semiconductor devices, and more particularly relate to semiconductor devices comprising a double sampling error correction apparatus and methods of operation thereof.

BACKGROUND

Sigma-delta modulators may be used to perform analog-to-digital or digital-to-analog conversion. To perform analog-to-digital conversion, for example, a conventional sigma-delta modulator measures and integrates the error in a signal, and performs error correction based on the integrated error. A conventional sigma-delta modulator may include at least one integrator, at least one feedback loop, and a quantizer. The order of the sigma-delta modulator is determined by the number of integrators.

A "single-sampling" sigma-delta modulator samples on one clock phase and integrates on the other clock phase. The differential amplifiers associated with the integrators of a single-sampling sigma-delta modulator are active only during the integration phase. Accordingly, both bandwidth and power are wasted when the differential amplifiers are idle during the sampling phase. A "double-sampling" sigma-delta modulator compensates for these deficiencies in single-sampling sigma-delta modulators by including a double-sampling integrator system. In such a system, sampling and integration are performed on both phases of a clock, thus achieving improved bandwidth and power consumption when compared with single-sampling sigma-delta modulators.

Although double-sampling sigma-delta modulators have advantages over single-sampling sigma-delta modulators, they may be improved. For example, some conventional double-sampling integrator systems have both continuous-time and discrete-time inputs (e.g., resistors and switched capacitor circuits, respectively). For a continuous-time input, the voltage at the input of the amplifier of an opamp-based integrator does not have to be small in order for the integrator system to perform well. However, for a discrete-time input, which may correspond to a feedback signal provided through a feedback loop, for example, the voltage at the input of the amplifier of an opamp-based integrator must be small after settling to avoid retaining a residual charge on the capacitors of the discrete-time input (e.g., the capacitors of the switched capacitor circuit). The inherent input offset may detrimentally affect performance by introducing a non-negligible second order harmonic. In order to address this discrepancy, some conventional double-sampling integrator systems include amplifiers with relatively large transconductance requirements. However, a drawback to such a system is the increased power consumption associated with the large-transconductance amplifier.

Accordingly, what is needed is a double-sampling integrator system that may have both continuous-time and discrete-time inputs, and a feedback sampling circuit that enables an amplifier to be employed that has a relatively small transconductance requirement. Desirably, such an integrator system will have high performance, relatively low power consumption, and a reduced sensitivity to quantizer input offset, when compared with a conventional double-sampling integrator system.

DETAILED DESCRIPTION

The following description refers to system components, elements, nodes or features being "coupled" or "electrically coupled" together. As used herein, unless expressly stated otherwise, the terms "coupled" and "electrically coupled" mean that one component/element/node/feature is directly or indirectly joined to (or directly or indirectly communicates with) another component/element/node/feature, and not necessarily mechanically. Thus, although the diagrams shown in the figures depict various exemplary arrangements of components/elements/nodes/features, additional intervening components, elements, nodes, features, or devices may be present in other embodiments of the depicted subject matter.

Figure 1:
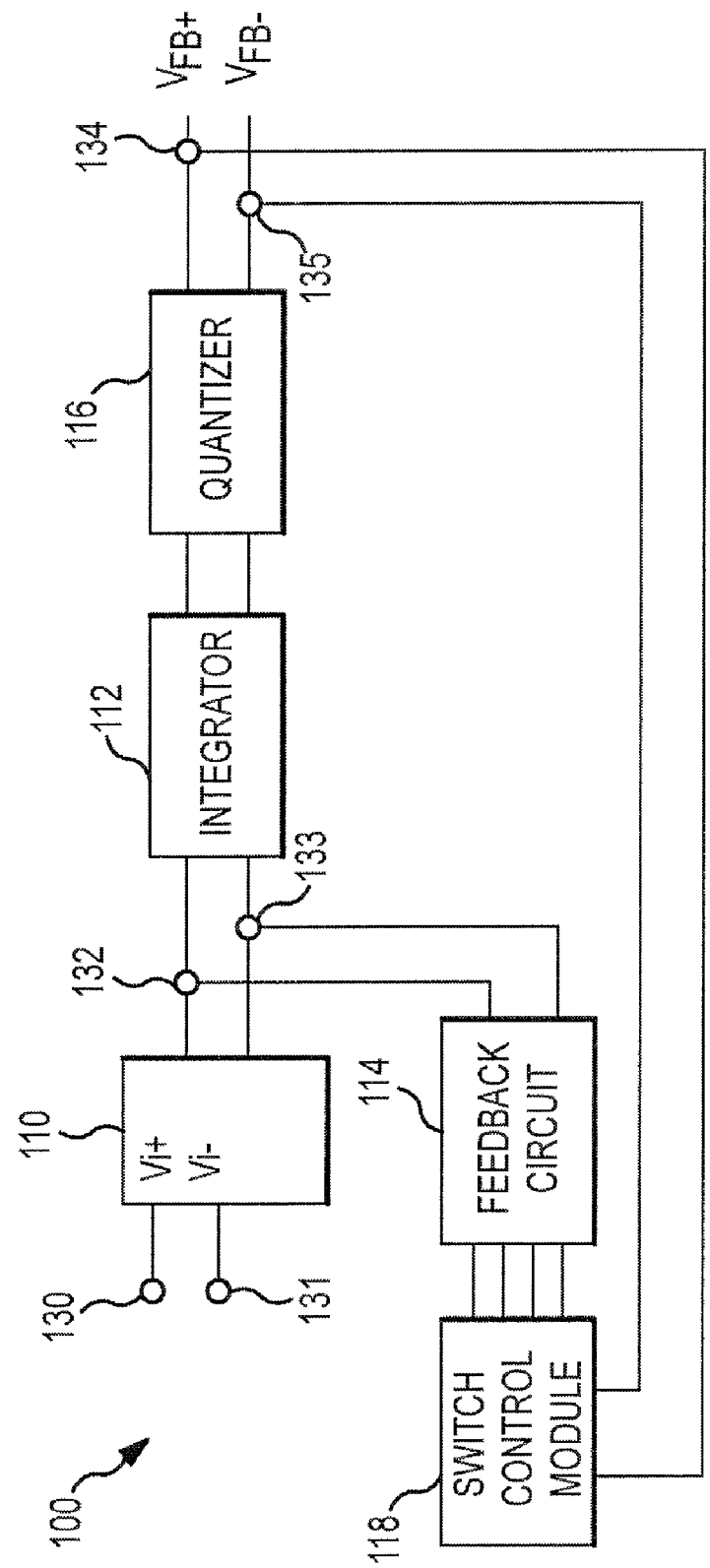
FIG. 1 illustrates a single-stage sigma delta modulator, according to an example embodiment.

Embodiments of the inventive subject matter include sampling modules, integration systems, sigma-delta modulators, and methods of their operation. For example, FIG. 1 illustrates a single-stage sigma delta modulator 100, according to an example embodiment. Modulator 100 includes an analog input module 110, an integrator 112, a quantizer 116, a switched-capacitor feedback circuit 114, and a switch control module 118. A differential signal to be integrated (e.g., a data-bearing, analog input signal) is received at differential input nodes 130, 131 of analog input module 110. Analog input module 110 has a differential output coupled to summing nodes 132, 133 of integrator 112. According to various embodiments, analog input module 110 may provide a continuous-time input or a discrete-time input to summing nodes 132, 133. More particularly, analog input module 110 may provide a data-bearing, differential signal to summing nodes 132, 133. Summing nodes 132, 133 also receive a differential signal produced by switched capacitor feedback circuit 114, and summing nodes produce a modified, data-bearing, differential signal that represents the combination of the data-bearing, differential signal from analog input module 110 and the differential signal from feedback circuit 114.

Integrator 112 is adapted to integrate the differential signal produced by summing nodes 132, 133. Signals present on differential output nodes of integrator 112 are provided to quantizer 116, which is adapted to quantize the integrated signal in order to produce a digital representation of the integrated signal. Quantizer 116 may include, for example a high gain comparator that is adapted to saturate given any non-negligible input. The output of quantizer 116 (e.g., the output of sigma delta modulator 100) includes a digital, binary value that is represented by two fixed voltages at nodes 134, 135. These voltages are referred to in FIG. 1 as $V_{FB}+$ and $V_{FB}$−. According to an embodiment, when the input to quantizer 116 is positive, $V_{FB}$+=1 and $V_{FB}$−=0. Alternatively, when the input to quantizer 116 is negative, $V_{FB}$+=0 and $V_{FB}$−=1.

The output of quantizer 116 is provided as a feedback signal to differential inputs of switch control module 118. Based on the feedback signal and a reference clock signal (not illustrated), switch control module 118 produces switching control signals to switched-capacitor feedback circuit 114. These switching control signals may include, for example, an odd clock phase signal, an even clock phase signal, and additional signals having values based on the odd clock phase signal, the even clock phase signal, and the value of the feedback signal. Switched-capacitor feedback circuit 114 produces a differential output, which is provided to summing nodes 132, 133 of integrator 112. Both switched-capacitor feedback circuit 114 and switch control module 118 will be described in further detail, below. It will be appreciated that while a single-stage sigma-delta modulator 100 has been illustrated in the example embodiment of FIG. 1, embodiments of sampling modules disclosed herein can be used with an n-stage sigma-delta modulator (n=2, . . . N) with m-bit quantization (m=1, 2, . . . M), in alternate embodiments. As used herein, the term "integration system" includes a combination of an analog module, an integrator, and a feedback circuit associated therewith. An integration system also may include control components, such as a switch control module for providing switching signals.

Figure 2:
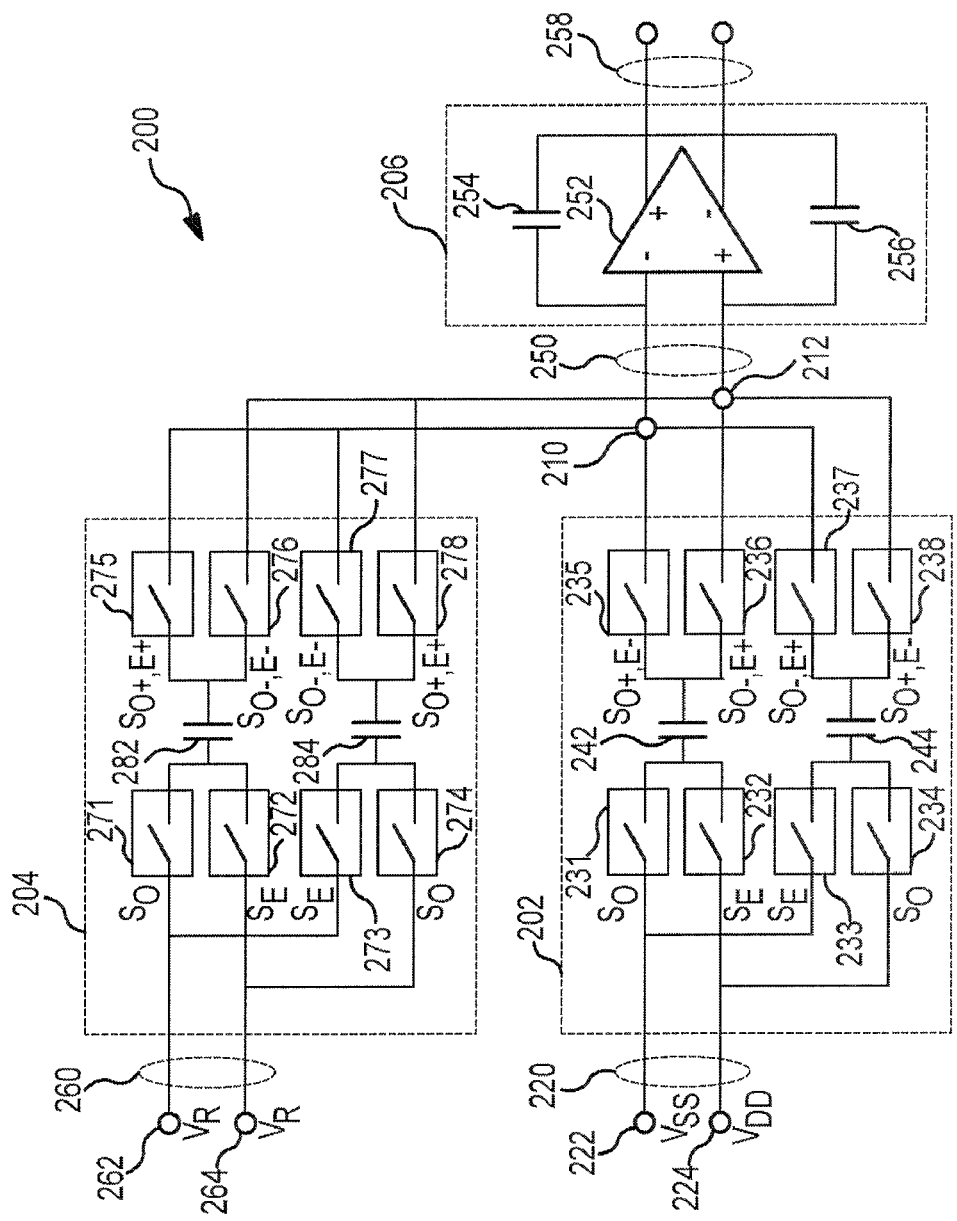
FIG. 2 illustrates an integration system that can be used in a stage of a sigma-delta modulator, according to an example embodiment.

FIG. 2 illustrates an integration system 200 that can be used in a stage of a sigma-delta modulator (e.g., sigma delta modulator 100, FIG. 1), according to an example embodiment. Integration system 200 includes a primary sampling module 202, a reference sampling module 204, and an integrator 206. The outputs of primary sampling module 202 and reference sampling module 204 are electrically coupled with integrator 206 through summing nodes 210, 212. Primary sampling module 202 and reference sampling module 204 represent an embodiment of a switched-capacitor feedback circuit (e.g., switched capacitor feedback circuit 114, FIG. 1), in an embodiment.

Integrator 206 includes differential input terminals 250, differential amplifier 252, output capacitors 254 and 256, and differential output terminals 258. Summing nodes 210 and 212 are electrically coupled to first and second terminals, respectively, of differential input terminals 250. Relative to each other, the first differential input terminal is a negative reference terminal, and the second differential input terminal is a positive reference terminal. Similarly, a first differential output terminal is a positive reference terminal and a second differential output terminal is a negative reference terminal.

Primary sampling module 202 includes input terminals 220, switches 231, 232, 233, 234, 235, 236, 237, and 238, and input capacitors 242, 244 (also referred to as "sampling" capacitors). As used herein, the term "switch," in the singular sense, may mean a single switch, or a switching apparatus that includes a plurality of switches. Accordingly, the use of the term "switch" in the singular sense in the description or claims is not meant to limit the scope of the embodiments to a single switch. Input terminals 220 include a first terminal 222 to receive a first input voltage, and a second terminal 224 to receive a second input voltage. The first and second input voltages may be, for example, the fixed voltages of $V_{SS}$ (e.g., from ground) and $V_{DD}$ (e.g., from power). In alternate embodiments, the input voltages may be represented by different fixed voltages, or one or both of the input voltages may be variable.

Each of switches 231-238 includes an input terminal, an output terminal, and a switching signal terminal (not illustrated). The input terminal and output terminal are selectively disconnected or connected (e.g., the switches are opened or closed, respectively) based on the state of the switching signal that may be present on the signal terminal. For purposes of discussion, an asserted signal received at the switching signal terminal of a switch results in the switch being closed, thus allowing a signal to propagate between the input and output terminals of the switch, and a negated signal received at the switching signal terminal of a switch results in the switch being opened, thus preventing a signal from propagating between the input and output terminals of the switch.

Figure 3:
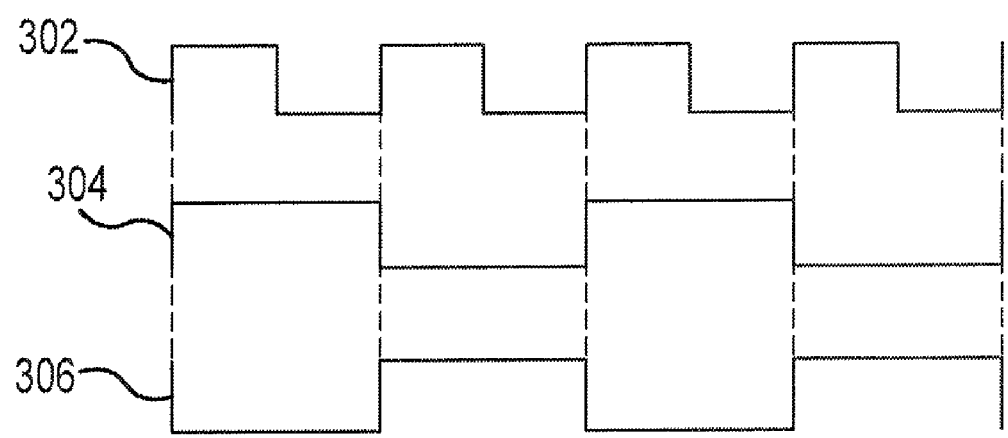
FIG. 3 is a timing diagram of an example reference clock signal, from which an odd clock phase signal and an even clock phase signal may be derived, according to an example embodiment.

Switches 231-234 are controlled by providing switching signals that are generated based on a reference clock signal that may be characterized as having an even phase (denoted as "E" herein) and an odd phase (denoted as "O" herein). The even clock phase and odd clock phase switching signals themselves are denoted as "$S_E$" and "$S_O$", respectively. FIG. 3 is a timing diagram of an example reference clock signal 302, from which an odd clock phase signal 304 and an even clock phase signal 306 may be derived, according to an embodiment. According to an embodiment, the odd clock phase signal 304 and the even clock phase signal 306 are non-overlapping and used to control switches 231-234 and 271-274 (e.g., the odd clock phase signal 304 and the even clock phase signal 306 are provided as input signals to the switching signal terminals of switches 231-234 and 271-274). Reference clock signal 302 represents a binary clock that alternates between high and low logic levels at a first frequency. Odd clock phase signal 304 is generated based on reference clock signal 302, and alternates between high and low logic level at a second frequency that is substantially half of the first frequency. Accordingly, during odd clock cycles of reference clock signal 302, odd clock phase signal 304 has a high logic level, and during even clock cycles of reference clock signal 302, odd clock phase signal 304 has a low logic level. Even clock phase signal 306 also is generated based on reference clock signal 302, and alternates between high and low logic levels at the second frequency and substantially (e.g., about 180 degrees) out of phase with the odd clock phase signal 304. An embodiment of a switching signal generation module (e.g., switch control module 118, FIG. 1) will be described in more detail in conjunction with the description of FIG. 4, later. As used herein, a "switching cycle" corresponds to half of an odd clock cycle or half of an even clock cycle.

In the example embodiments provided herein, a high logic level, e.g., a "1", corresponds to an asserted signal, and a low logic level, e.g., "0" corresponds to a negated signal. When an asserted signal is present at a switching signal terminal of a switch (e.g., switches 231-238), the switch will close or remain closed, and when a negated signal is present at a switching signal terminal of a switch, the switch will open or remain open. This convention is for purposes of convenience and not of limitation. In alternate embodiments, one or more switches alternatively or additionally may be employed for which an asserted signal may cause a switch to open, and a negated signal may cause the switch to close.

Referring back to FIG. 2, switches 231 and 234 are controlled by a control signal derived from an odd clock phase signal (e.g., odd clock phase signal 304, FIG. 3), and switches 232 and 233 are controlled by a control signal derived from an even clock phase signal (e.g., even clock phase signal 306, FIG. 3). Accordingly, switches 231, 234 are opened and closed synchronously with each other, and are opened and closed substantially (e.g., about 180 degrees) out of phase with the opening and closing of switches 232, 233. Similarly, switches 232, 233 are opened and closed synchronously with each other, and are opened and closed substantially (e.g., about 180 degrees) out of phase with the opening and closing of switches 231, 234. To indicate the synchronous and out of phase operation of switches 231-234, the annotation "$S_O$" in proximity to switches 231, 234 in FIG. 2 indicates switching synchronization based on an odd clock signal, and the annotation "$S_E$" in proximity to switches 232, 233 indicates switching synchronization based on an even clock signal, where the odd and even clock signals are out of phase with each other. According to an embodiment, when the odd clock signal has a high logic level (and the even clock signal has a low logic level), control signals are provided to switches 231, 234 to cause those switches to be in a closed state, and other control signals are provided to switches 232, 233 to cause those switches to be in an open state. Conversely, when the even clock signal has a high logic level (and the odd clock signal has a low logic level), control signals are provided to switches 232, 233 to cause those switches to be in a closed state, and other control signals are provided to switches 231, 234 to cause those switches to be in an open state.

In contrast to the control of switches 231-234, switches 235-238 are controlled by control signals that are derived from the odd and even clock phase signals (e.g., odd clock phase signal 304 and even clock phase signal 306, FIG. 3) in combination with the value of a differential feedback signal (e.g., feedback signal $V_{FB}+$ and $V_{FB}-$ provided by quantizer 116, FIG. 1). According to an embodiment, the feedback signal may have a positive polarity (denoted as "+" herein), or the feedback signal may have a negative polarity (denoted as "−" herein).

The two potential states of the odd and even clock phase signals and the two potential polarities of the feedback signal give rise to the following four potential combined states, only one of which would be present during a given switching cycle: 1) the odd clock phase signal having a high logic level and the feedback signal having a positive polarity (denoted as "O+" herein); 2) the odd clock phase signal having a high logic level and the feedback signal having a negative polarity (denoted as "O−" herein); 3) the even clock phase signal having a high logic level and the feedback signal having a positive polarity (denoted as "E+" herein); and 4) the even clock phase signal having a high logic level and the feedback signal having a negative polarity (denoted as "E−" herein).

According to an embodiment, when the odd clock phase signal has a high logic level and the feedback signal has a positive polarity, O+, or when the even clock phase signal has a high logic level and the feedback signal has a negative polarity, E−, control signals are provided to switches 235, 238 to cause those switches to be in a closed state, and other control signals are provided to switches 236, 237 to cause those switches to be in an open state. These conditions are indicated in FIG. 2 with the annotation "$S_{O+,E-}$" in proximity to switches 235, 238, where $S_{O+,E-}$ corresponds to a switching signal that is asserted under the conditions of O+ or E−, and is negated under the conditions of O− or E+. Conversely, when the even clock phase signal has a high logic level and the feedback signal has a positive polarity, E+, or when the odd clock phase signal has a high logic level and the feedback signal has a negative polarity, O−, control signals are provided to switches 236, 237 to cause those switches to be in a closed state, and other control signals are provided to switches 235, 238 to cause those switches to be in an open state. These conditions are indicated in FIG. 2 with the annotation "$S_{O-,E+}$" in proximity to switches 236, 237, where $S_{O-,E+}$ corresponds to a switching signal that is asserted under the conditions of O− or E+, and is negated under the conditions of O+ or E−. In actual implementation, some or all of switches 235-238 (and/or switches 275-278, discussed later) may be implemented using a plurality (e.g., two or more) of switches. For example, each of switches 235-238 (and/or switches 275-278, discussed later) may be implemented using two parallel switches, where a first switch is controlled based on the odd clock phase signal, and a second (parallel) switch is controlled based on the even clock phase signal. As a more specific example, switch 235 may have a first switch that is adapted to close when the odd clock phase signal has a high logic level and the and the feedback signal has a positive polarity, O+, and switch 235 may include a second switch, in parallel with the first switch, that is adapted to close when the even clock phase signal has a high logic level and the feedback signal has a negative polarity, E−. Other switch configurations alternatively may be used to provide the various connections discussed herein, in alternate embodiments. Generation of the switching signals $S_{O-,E+}$ and $S_{O+,E-}$ will be described in more detail in conjunction with FIG. 4.

Figure 4:
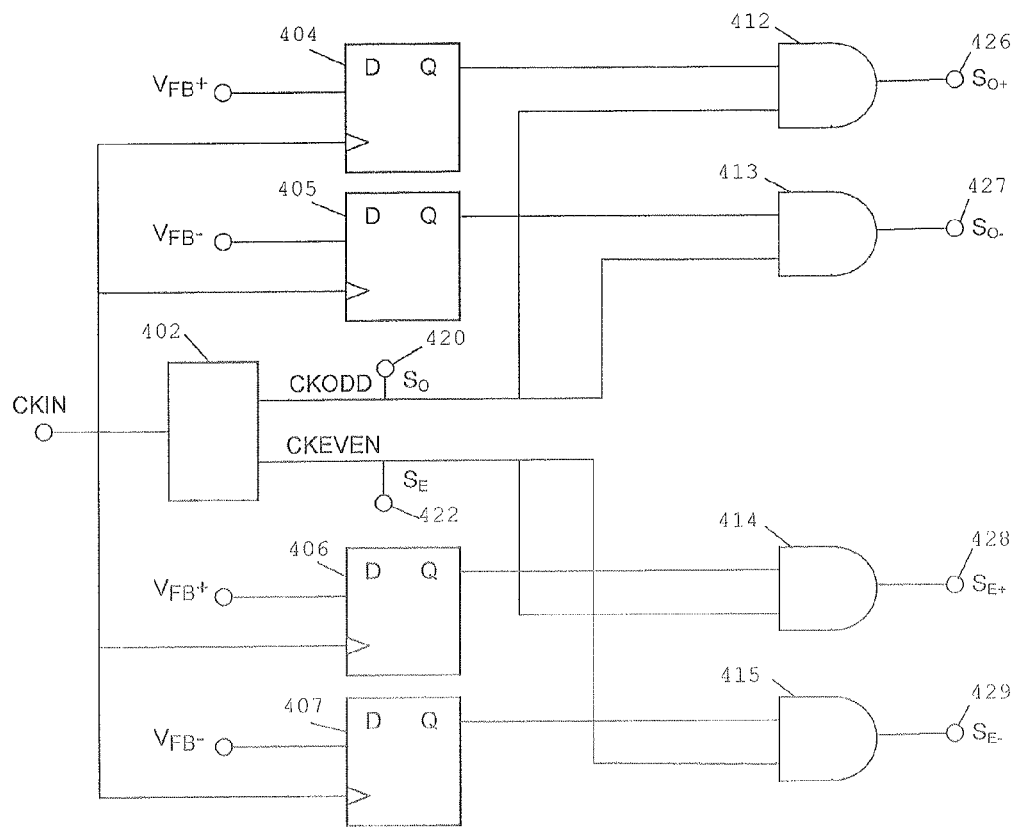
FIG. 4 illustrates a simplified block diagram of a control module adapted to provide various switching signals, according to an example embodiment.

FIG. 4 illustrates a simplified block diagram of a control module 400 (e.g., switch control module 118, FIG. 1) to provide first and second switching signals, $S_O$ and $S_E$, corresponding to the odd and even clocks, and switching signals $S_{O+}$, $S_{O-}$, $S_{E+}$, and $S_{E-}$ that are asserted under the conditions of o+, o−, E+, and E−, respectively, according to an embodiment. Although control module 400 is illustrated to have a particular configuration in order to produce the various switching signals, it is to be understood that a vast number of variations for producing the switching signals exist, including implementing multiple control modules to produce the signals and/or implementing control modules having different configurations to produce the signals. Accordingly, control modules having different configurations are intended to be included within the scope of the inventive subject matter.

According to an embodiment, control module 400 includes clock generator 402, latches 404, 405, 406, 407, and AND gates 412, 413, 414, 415. Clock generator 402 receives a reference clock signal, CKIN (e.g., reference clock signal 302, FIG. 3), and produces an odd clock signal, CKODD or $S_O$ (e.g., odd clock phase signal 304, FIG. 3) and an even clock signal, CKEVEN or $S_E$ (e.g., even clock phase signal 306, FIG. 3) from the reference clock signal. According to an embodiment, the odd clock signal and the even clock signal are non-overlapping clocks. The odd clock signal may be provided as the odd clock phase switching signal, $S_O$, via electrical couplings between a first output 420 and the switching signal terminals of switches 231, 234, 271, and 274 (FIG. 2). Similarly, the even clock signal may be provided as the even clock phase switching signal, $S_E$, via electrical couplings between a second output 422 and the switching signal terminals of switches 232, 233, 272, and 273 (FIG. 2).

Latches 404-407 are illustrated specifically as d-flip flops. The clocking node of each of latches 404-407 also receives CKIN and provides a clocking pulse to each latch 404-407. The data input, D, of each latch 404-407 is coupled either to a first output or to a second output of the sigma delta modulator (e.g., either the feedback signal $V_{FB}+$ or the feedback signal $V_{FB}-$ present at output nodes 134 or 135 of quantizer 116, FIG. 1). More specifically, according to an embodiment, the data input of latches 404 and 406 are coupled to a first output of the sigma delta modulator (e.g., to receive the feedback signal $V_{FB+}$), and the data input of latches 405 and 407 are coupled to a second output of the sigma delta modulator (e.g., to receive the feedback signal $V_{FB-}$). The input feedback signals are clocked through, by latches 404-407 to first inputs of AND gates 412-415.

Each of AND gates 412-415 also receives, at a second input, either the odd clock signal, $S_O$, or the even clock signal, $S_E$. More specifically, according to an embodiment, the second inputs of AND gates 412 and 413 are coupled to receive odd clock signal, $S_O$, and the second inputs of AND gates 414 and 415 are coupled to receive even clock signal, $S_E$. AND gates 412-415 perform and AND operation to their first and second inputs to produce output signals at outputs 426, 427, 428, and 429. More specifically, according to an embodiment, AND gate 412 produces switching signal $S_{O+}$ at a first output 426, AND gate 413 produces switching signal S at a second output 427, AND gate 414 produces switching signal S at a third output 428, and AND gate 415 produces switching signal $S_{E-}$ at a fourth output 429. The signals present at outputs 426-429 may be provided as switching signals $S_{O+}$, $S_{O-}$, $S_{E+}$, and $S_{E-}$ via electrical couplings between the outputs 426-429 and the switching signal terminals of switches 235-238 and 275-278 (FIG. 2).

Referring again to FIG. 2, now that primary sampling module 202 has been described, reference sampling module 204 will be described in more detail. According to an embodiment, reference sampling module 204 is configured substantially similarly to primary sampling module 202, and includes a differential input 260, switches 271, 272, 273, 274, 275, 276, 277, and 278, and input capacitors 282, 284. Each of these components is interconnected in substantially the same manner as the analogous components of the primary sampling module 202, according to an embodiment. In alternate embodiments, reference sampling module 204 may be configured differently from primary sampling module 202, while still being operable to produce a configuration change when primary sampling module 202 does not (and to refrain from producing a configuration change when primary sampling module 202 does), as will be explained in more detail later. As used herein, the term "configuration change" may refer to a change in a connection status (e.g., a change, from one switching cycle to a next switching cycle, from a status of being connected to a status of not being connected, or vice versa) between a capacitor of a sampling module and a terminal of a differential amplifier (e.g., differential amplifier 252).

Differential input 260 includes a first terminal 262 and a second terminal 264, each of which receive a substantially non-variable reference voltage, labeled $V_R$. The reference voltage may be received, for example, from a reference voltage source (not illustrated). According to an embodiment, the reference voltage has a value between the input voltages at input terminals 220 (e.g., approximately halfway between $V_{SS}$ and $V_{DD}$).

Each of switches 271-278 includes an input terminal, an output terminal, and a switching signal terminal (not illustrated). The input terminal and output terminal are selectively disconnected or connected (e.g., the switches are opened or closed, respectively) based on the state of the switching signal that may be present on the signal terminal. As with switches 231-234 of the primary sampling module 202, switches 271-274 are controlled based on an even clock phase signal and an odd clock phase signal (e.g., signals 304, 306, FIG. 3). According to an embodiment, the switches 271-274 of reference sampling module 204 are closed and opened substantially in phase with corresponding switches 231-234 of primary sampling module 202. Sets of "corresponding" switches include a first set with switches 231, 271, a second set with switches 232, 272, a third set with switches 233, 273, and a fourth set with switches 234, 274. For example, both switches (e.g., switches 231, 271 or switches 232, 272) of each set of corresponding switches are controlled by a control signal derived from an odd clock phase signal or an even clock phase signal. Accordingly, corresponding switches are opened and closed substantially in phase with each other.

More particularly, switches 272 and 273 are controlled by the control signal, $S_E$, derived from an even clock phase signal (e.g., even clock phase signal 306, FIG. 3), and switches 271 and 274 are controlled by the control signal, $S_O$, derived from an odd clock phase signal (e.g., odd clock phase signal 304, FIG. 3). Accordingly, switches 272, 273 are opened and closed synchronously with each other and with switches 232, 233, and are opened and closed substantially (e.g., about 180 degrees) out of phase with the opening and closing of switches 271, 274 and with switches 231, 234. Similarly, switches 271, 274 are opened and closed synchronously with each other and with switches 231, 234, and are opened and closed substantially (e.g., about 180 degrees) out of phase with the opening and closing of switches 272, 273 and switches 232, 233. As discussed previously, to indicate the synchronous and out of phase operation of switches 231-234 and 271-274, the annotation "$S_O$" in proximity to switches 231, 234, 271, 274 in FIG. 2 indicates switching synchronization based on an odd clock signal, and the annotation "$S_E$" in proximity to switches 232, 233, 272, 273 indicates switching synchronization based on an even clock signal, where the odd and even clock signals are out of phase with each other.

As with switches 235-238 of the primary sampling module 202, switches 275-278 are controlled by control signals that are derived from the odd and even clock phase signals (e.g., odd clock phase signal 304 and even clock phase signal 306, FIG. 3) in combination with the polarity of the feedback signal (e.g., a feedback signal provided by quantizer 116, FIG. 1). However, according to an embodiment, the switches 275-278 of reference sampling module 204 are closed and opened so that they will produce a configuration change at times when primary sampling module 202 does not, as will be described in more detail below.

According to an embodiment, when the odd clock phase signal has a high logic level and the feedback signal has a negative polarity, O−, or when the even clock phase signal has a high logic level and the feedback signal has a negative polarity, E−, control signals, $S_{O-,E-}$, are provided to switches 276, 277 to cause those switches to be in a closed state, and other control signals are provided to switches 275, 278 to cause those switches to be in an open state. These conditions are indicated in FIG. 2 with the annotation "$S_{O-,E-}$" in proximity to switches 276, 277, where $S_{O+,E+}$ corresponds to a switching signal that is asserted under the conditions of O− or E−, and is negated under the conditions of O+ or E+. Conversely, when the even clock phase signal has a high logic level and the feedback signal has a positive polarity, E+, or when the odd clock phase signal has a high logic level and the feedback signal has a positive polarity, O+, control signals, $S_{O+,E+}$, are provided to switches 275, 278 to cause those switches to be in a closed state, and other control signals are provided to switches 276, 277 to cause those switches to be in an open state. These conditions are indicated in FIG. 2 with the annotation "$S_{O+,E+}$" in proximity to switches 275, 278, where $S_{O+,E+}$ corresponds to a switching signal that is asserted under the conditions of O+ or E+, and is negated under the conditions of O− or E−. According to an embodiment, the assertions of So+,e+, So−,e−, So+,e− and So−,e+, are disjoint, meaning that there are no times during which they are simultaneously asserted (e.g., their assertion periods do not overlap).

Figure 5:
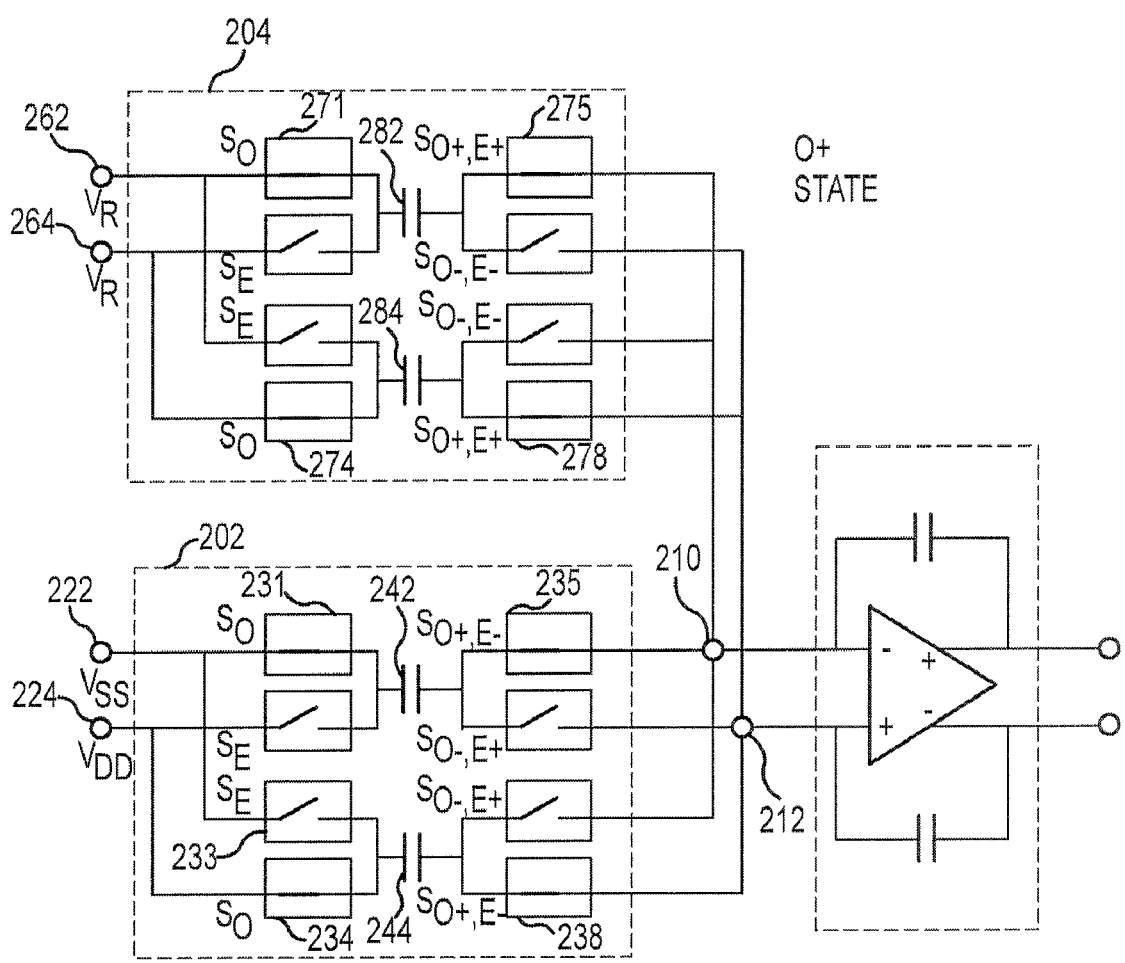
FIGS. 5-8 illustrate various configurations of the switches of a primary sampling module and a reference sampling module, according to an example embodiment.

Based on the above-described switching control parameters, the switches of primary sampling module 202 and reference sampling module 204 may be connected to integrator 206 via one of four possible states. Because, in an embodiment, the assertions of So+,e+, So–,e–, So+,e– and So–,e+ are disjoint, both of sampling modules 202, 204 will be disconnected from integrator 206 during brief times in which transitions are being made between the four states (e.g., the configuration in which both sampling modules 202, 204 are disconnected from integrator 206 may be considered a "fifth state."). FIGS. 5-8 illustrate these four possible states. More particularly, FIG. 5 illustrates a configuration of the switches of primary sampling module 202 and reference sampling module 204 under the condition of the odd clock phase signal having a high logic level and the feedback signal having a positive polarity, or O+. As FIG. 5 indicates, under these conditions, the first terminal 222 of differential input 220 and the first terminal 262 of differential input 260 are electrically coupled through switches 231, 235 or switches 271, 275 to summing node 210. Conversely, the second terminal 224 of differential input 220 and the second terminal 264 of differential input 260 are electrically coupled through switches 234, 238 or 274, 278 to summing node 212. Accordingly, $V_{SS}$ and $V_R$ are applied to summing node 210 across input capacitors 242, 282, and $V_{DD}$ and $V_R$ are applied to summing node 212 across input capacitors 244, 284.

Figure 6:
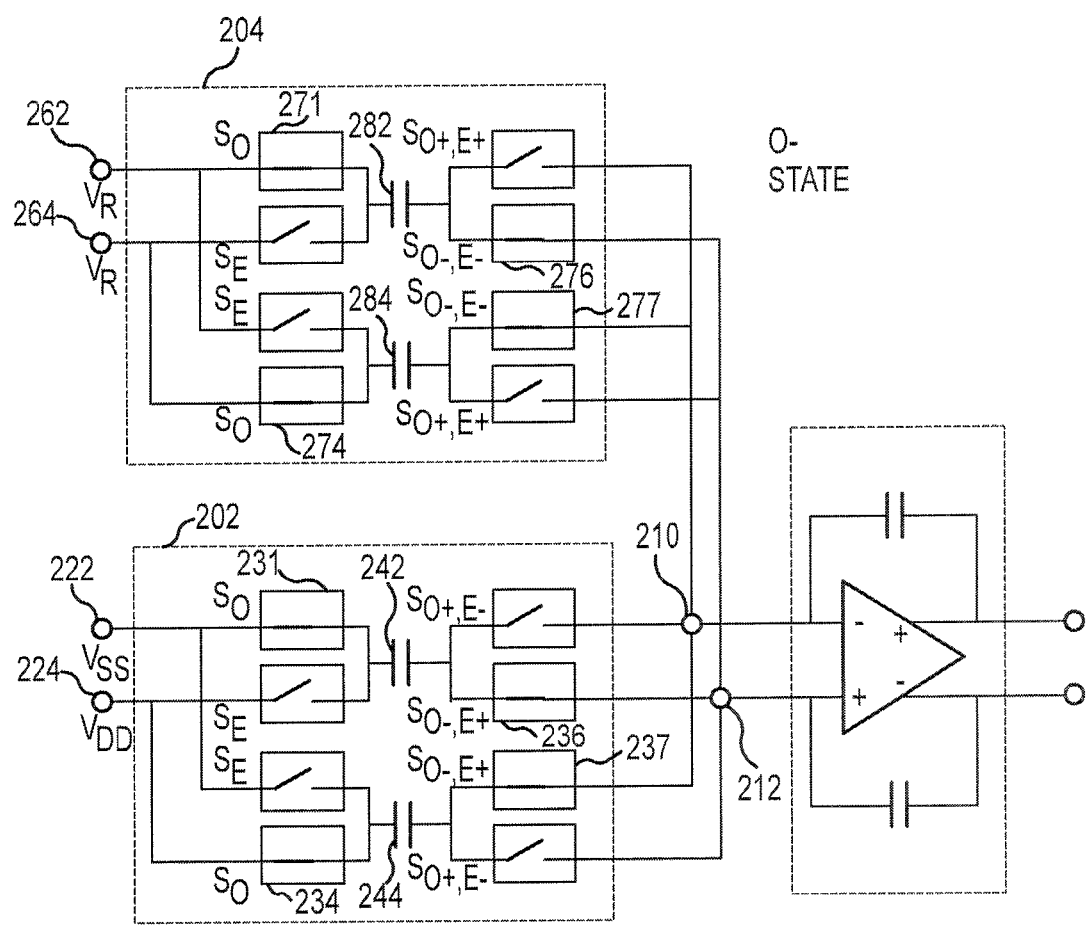

FIG. 6 illustrates a configuration of the switches of primary sampling module 202 and reference sampling module 204 under the condition of the odd clock phase signal having a high logic level and the feedback signal having a negative polarity, or O–. As FIG. 6 indicates, under these conditions, the first terminal 222 of differential input 220 and the first terminal 262 of differential input 260 are electrically coupled through switches 231, 236 or switches 271, 276 to summing node 212. Conversely, the second terminal 224 of differential input 220 and the second terminal 264 of differential input 260 are electrically coupled through switches 234, 237 or 274, 277 to summing node 210. Accordingly, $V_{SS}$ and $V_R$ are applied to summing node 212 across input capacitors 242, 282, and $V_{DD}$ and $V_R$ are applied to summing node 210 across input capacitors 244, 284.

Figure 7:
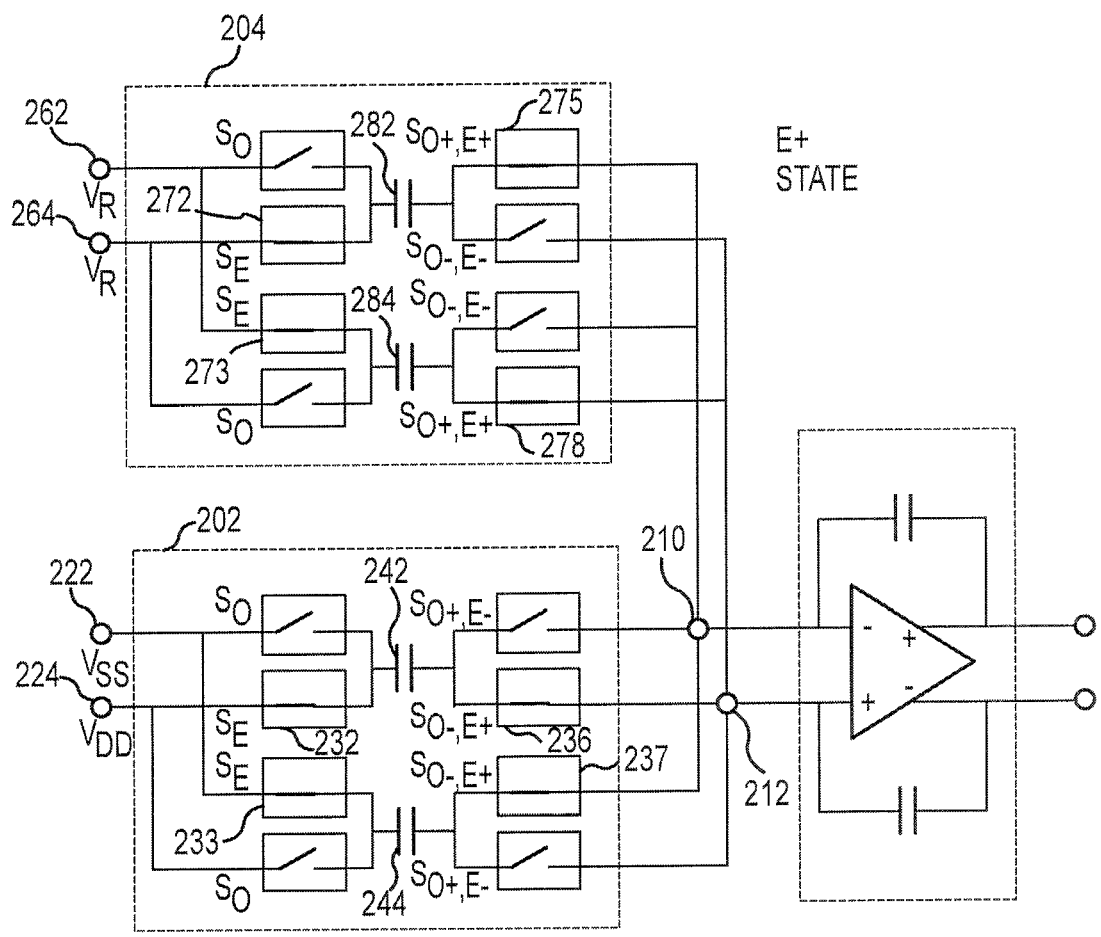

FIG. 7 illustrates a configuration of the switches of primary sampling module 202 and reference sampling module 204 under the condition of the even clock phase signal having a high logic level and the feedback signal having a positive polarity, or E+. As FIG. 7 indicates, under these conditions, the first terminal 222 of differential input 220 is electrically coupled through switches 233, 237 to summing node 210, and the first terminal 262 of differential input 260 is electrically coupled through switches 273, 278 to summing node 212. Conversely, the second terminal 224 of differential input 220 is electrically coupled through switches 232, 236 to summing node 212, and the second terminal 264 of differential input 260 is electrically coupled through switches 272, 275 to summing node 210. Accordingly, $V_{SS}$ and $V_R$ are applied to summing node 210 across input capacitors 244, 282, and $V_{DD}$ and $V_R$ are applied to summing node 212 across input capacitors 244, 284.

Figure 8:
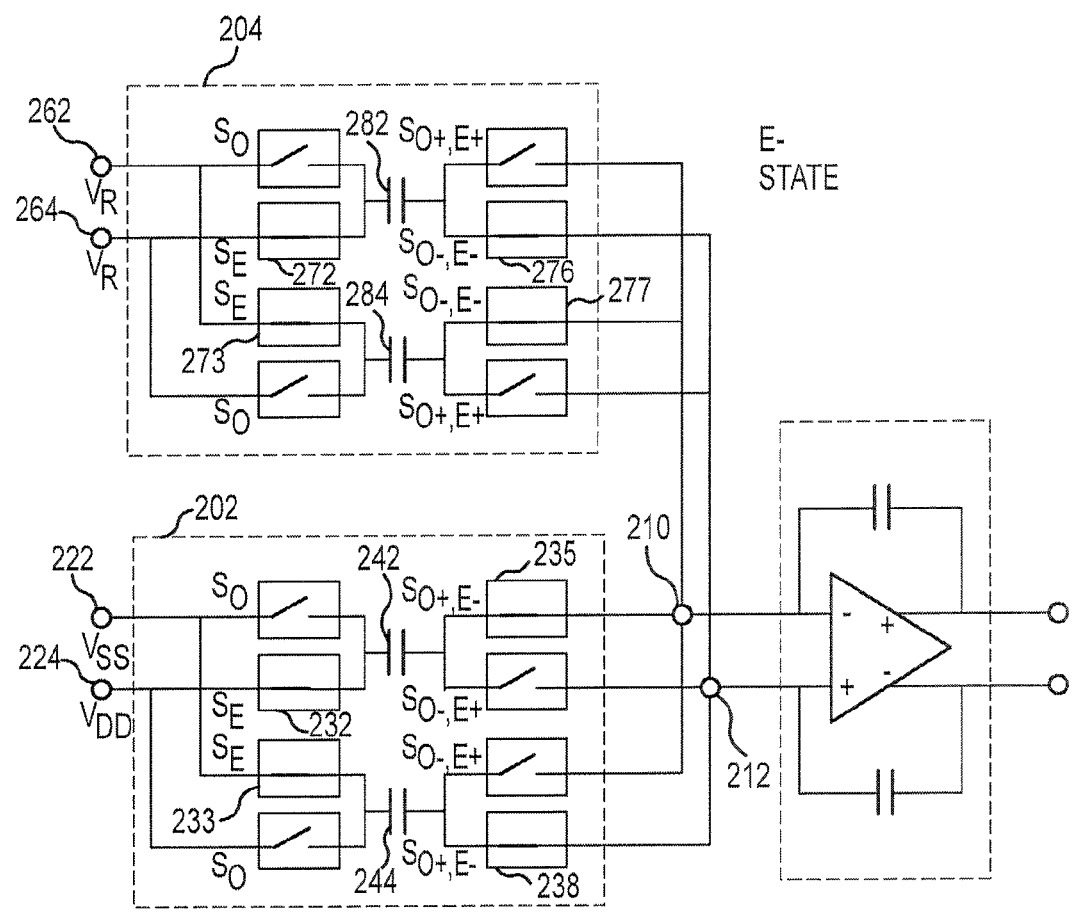

Finally, FIG. 8 illustrates a configuration of the switches of primary sampling module 202 and reference sampling module 204 under the condition of the even clock phase signal having a high logic level and the feedback signal having a negative polarity, or E–. As FIG. 8 indicates, under these conditions, the first terminal 222 of differential input 220 is electrically coupled through switches 233, 238 to summing node 212, and the first terminal 262 of differential input 260 is electrically coupled through switches 273, 277 to summing node 210. Conversely, the second terminal 224 of differential input 220 is electrically coupled through switches 232, 235 to summing node 210, and the second terminal 264 of differential input 260 is electrically coupled through switches 272, 276 to summing node 212. Accordingly, $V_{SS}$ and $V_R$ are applied to summing node 212 across input capacitors 244, 282, and $V_{DD}$ and $V_R$ are applied to summing node 210 across input capacitors 242, 284.

As indicated in FIG. 3, from one switching cycle to the next, the odd clock phase signal and the even clock phase signal continuously alternate between a high logic level and a low logic level in a manner that is substantially (e.g., about 180 degrees) out of phase with each other. Accordingly, the switching signals provided to switches 231-234 and 271-274 continuously alternate, at various phases, from switching cycle to switching cycle as follows: O asserted (and E negated), E asserted (and O negated), O asserted (and E negated), E asserted (and O negated), and so on. The polarity of the feedback signal, on the other hand, may or may not change from one switching cycle to the next, because the feedback signal is a data-dependent signal. That being said, with the possible clock phase/feedback signal polarity conditions under which integration can occur being O+, O–, E+, and E–, only the following possible transitions between clock phase/feedback signal polarity would occur during normal operations:

1) O+ to E+;
2) O+ to E–;
3) O– to E+;
4) O– to E–;
5) E+ to O+;
6) E+ to O–;
7) E– to O+; and
8) E– to O–.

Depending on the state (e.g., O+, O–, E+ or E–), input capacitor 242 is connected to one of summing nodes 210 or 212, and input capacitor 244 is connected to the other of summing nodes 210 or 212. Similarly, depending on the state, input capacitor 282 is connected to one of summing nodes 210 or 212, and input capacitor 284 is connected to the other of summing nodes 210 or 212. For example, in the O+ state (e.g., as represented in FIG. 5), input capacitors 242, 282 are connected to summing node 210 and input capacitors 244, 284 are connected to summing node 212. In the O– state (e.g., as represented in FIG. 6), input capacitors 244, 284 are connected to summing node 210 and input capacitors 242, 282 are connected to summing node 212. In the E+ state (e.g., as represented in FIG. 7), input capacitors 242, 284 are connected to summing node 212 and input capacitors 244, 282 are connected to summing node 210. Finally, in the E– state (e.g., as represented in FIG. 8), input capacitors 242, 284 are connected to summing node 210 and input capacitors 244, 282 are connected to summing node 212. For some of the possible transitions between clock phase/feedback signal polarity given above, the connection between an input capacitor 242, 244, 282, 284 and a summing node 210, 212 changes, and for other transitions, the connection between an input capacitor 242, 244, 282, 284 and a summing node 212, 212 does not change. A connection change between an input capacitor 242, 244, 282, 284 and a summing node 210, 212 is referred to herein as a "configuration change". The occurrence or non-occurrence of a configuration change in the primary sampling module 202 and the reference sampling module 204 for the above-listed transitions is summarized in Table 1, below, as follows:

| Transition | Configuration change in primary sampling module 202? | Configuration change in reference sampling module 204? |
| --- | --- | --- |
| O+ to E+ | YES | NO |
| O+ to E− | NO | YES |
| O− to E+ | NO | YES |
| O− to E− | YES | NO |
| E+ to O+ | YES | NO |
| E+ to O− | NO | YES |
| E− to O+ | NO | YES |
| E− to O− | YES | NO |

Whether or not a configuration change occurs from transition-to-transition depends on the polarity of the feedback signal. Notably, in primary sampling module 202, a configuration change occurs when the polarity of the feedback signal remains the same through the switching cycle transition (e.g., the feedback signal is "+" to "+" or "−" to "−" through the transition), and no configuration change occurs when the polarity of the feedback signal changes through the switching cycle transition (e.g., the feedback signal is "+" to "−" or "−" to "+" through the transition). In contrast, in reference sampling module 204, no configuration change occurs when the polarity of the feedback signal remains the same through the switching cycle transition, and a configuration change occurs when the polarity of the feedback signal changes through the switching cycle transition. In a sigma-delta modulator (e.g., sigma-delta modulator 100, FIG. 1), the feedback signal polarity corresponds to the analog input signal (e.g., the input signal to analog input module 110, FIG. 1), and accordingly the feedback signal polarities and the corresponding configuration changes are data dependent. In conventional sigma-delta modulators, data dependency may result in undesirable harmonics of the input signal, reducing the accuracy and/or performance of the sigma-delta modulator.

According to an embodiment, and as the above discussion and Table 1 indicate, reference sampling module 204 is configured and controlled in a manner that compensates for the data dependent nature of the configuration changes that may occur in primary sampling module 202. According to an embodiment, when a transition between clock phase/feedback signal polarities results in a configuration change in primary sampling module 202 (e.g., the differential amplifier input to which capacitor 242 and/or 244 is connected changes), reference sampling module 204 is controlled to produce no configuration change within itself (e.g., the differential amplifier input to which capacitor 282 and/or 284 is connected does not change). In addition, when a transition between clock phase/feedback signal polarities does not result in a configuration change in primary sampling module 202 (e.g., the differential amplifier input to which capacitor 242 and/or 244 is connected does not change), reference sampling module 204 is controlled to produce a configuration change within itself (e.g., the differential amplifier input to which capacitor 282 and/or 284 is connected changes). Accordingly, a single configuration change is produced for each and every transition from one switching cycle to the next, as Table 1 indicates, either in primary sampling module 202 or in reference sampling module 204. Because a configuration change will occur for each transition, independent of the polarity of the feedback signal, the operation of the switched capacitor feedback circuit (e.g., the combination of primary sampling module 202 and reference sampling module 204) is not data dependent, and the integration system 200 may have improved accuracy and/or performance when compared with conventional sigma-delta modulators.

Figure 9:
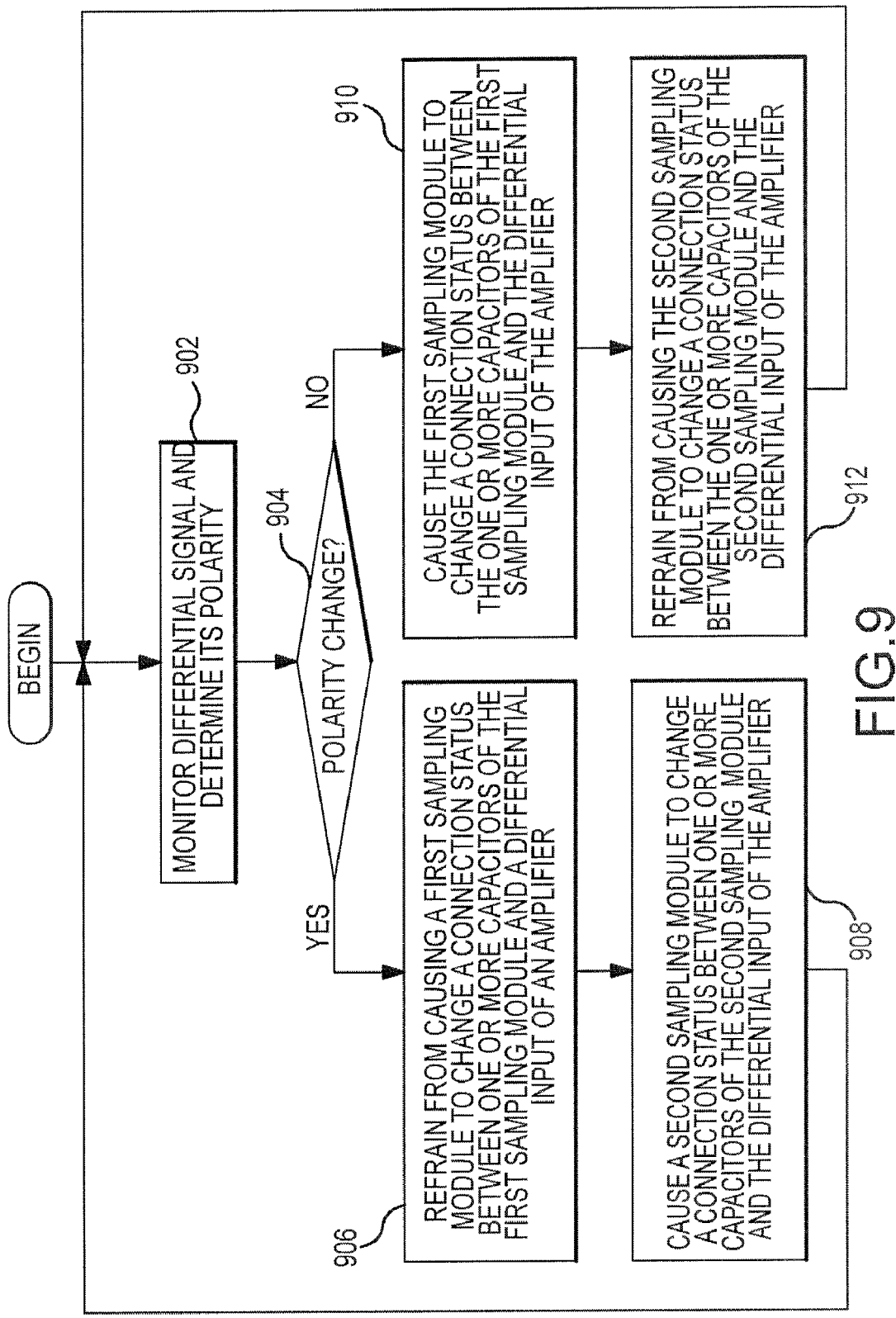
FIG. 9 is a flowchart of a method for operating an integration system, according to an example embodiment.

FIG. 9 is a flowchart of a method for operating an integration system, according to an example embodiment. Embodiments may be performed, for example, in an embodiment of an integration system such as that illustrated in FIG. 2. As discussed previously in detail, an integration system according to an embodiment includes a first sampling module (e.g., primary sampling module 202, FIG. 2), a second sampling module (e.g., reference sampling module 204, FIG. 2), and an integrator (e.g., integrator 206, FIG. 2). The integrator may include a differential amplifier (e.g., differential amplifier 252, FIG. 2) having a differential input (e.g., differential input 250 connected to summing nodes 210, 212, FIG. 2). Alternate embodiments may be performed in integration systems that are configured differently from the integration system illustrated in FIG. 2.

The method begins, in block 902, by monitoring a differential input signal (e.g., $V_{FB}+$ and $V_{FB}-$) produced at a differential output (e.g., output nodes 134, 135, FIG. 1) to determine a polarity of the differential input signal, where the polarity of the differential input signal is capable of being positive or negative. According to an embodiment, this monitoring operation may be performed by a switch control module (e.g., switch control module 118, FIG. 1 or control module 400, FIG. 4), and occurs during each switching cycle. A determination is made, in block 904, whether a polarity of the differential input signal has changed, from the previous switching cycle, between positive and negative (e.g., from positive to negative or from negative to positive).

In response to determining that the polarity of the differential input signal has changed between positive and negative, then in block 906, the switch control module refrains from producing control signals that otherwise would cause a first sampling module (e.g., primary sampling module 202, FIG. 2) of the switched-capacitor feedback circuit to change a connection status between one or more capacitors (e.g., capacitor 242 and/or 244, FIG. 2) of the first sampling module and the differential input of the differential amplifier (e.g., a configuration change is not caused in the first sampling module). By refraining to produce such control signals, the switch control module refrains from causing a change in the connection status, and refrains from causing a configuration change. In addition, control signals are generated, in block 908, which are adapted to cause a second sampling module (e.g., reference sampling module 204, FIG. 2) of the switched-capacitor feedback circuit (e.g., feedback circuit 114, FIG. 1) to change a connection status between one or more capacitors (e.g., capacitor 282 and/or 284, FIG. 2) of the second sampling module and the differential input of the differential amplifier (e.g., a configuration change is caused in the second sampling module). According to an embodiment, the second sampling module includes a plurality of switches that control the connection status between the one or more capacitors of the second sampling module and the differential input, and causing the second sampling module to change the connection status includes providing switching signals adapted to cause the switches of the second sampling module to change their states of being opened or closed (e.g., a switch that is in a closed state will switch to an open state, or vice versa). The method may then iterate as shown in FIG. 9.

In response to determining, in block 904, that the polarity of the differential input signal remains positive or negative (e.g., the polarity has not changed between consecutive switching cycles), control signals are generated, in block 910, which are adapted to cause the first sampling module (e.g., primary sampling module 202, FIG. 2) to change a connection status between one or more capacitors (e.g., capacitor 242 and/or 244, FIG. 2) of the first sampling module and the differential input of the differential amplifier (e.g., a configuration change is caused in the first sampling module). According to an embodiment, the first sampling module also includes a plurality of switches that control the connection status between the one or more capacitors of the first sampling module and the differential input, and causing the first sampling module to change the connection status includes providing switching signals adapted to cause the switches of the first sampling module to change their states of being opened or closed (e.g., a switch that is in a closed state will switch to an open state, or vice versa). In addition, in block 912, the switch control module refrains from producing control signals that otherwise would cause the second sampling module (e.g., reference sampling module 204, FIG. 2) to change a connection status between one or more capacitors (e.g., capacitor 282 and/or 284, FIG. 2) of the second sampling module and the differential input of the differential amplifier (e.g., a configuration change is not produced in the second sampling module). The method may then iterate as shown in FIG. 9.

The differential amplifier (e.g., differential amplifier 252, FIG. 2) receives, at its differential input (e.g., differential input 250, FIG. 2), the signals that are provided by the first and second sampling modules, and integrates differences between signals in order to produce a differential signal at the amplifier's differential output (e.g., differential output 258, FIG. 2). In an embodiment implemented in a sigma-delta modulator (e.g., sigma-delta modulator 100, FIG. 1), the differential signal produced by the differential amplifier then may be provided to summing nodes (e.g., summing nodes 132, 133, FIG. 1), which are adapted to sum the differential signal with a data-bearing differential signal (e.g., the differential output signal produced by sampling module 110, FIG. 1). As discussed previously in conjunction with FIG. 1, the resulting, modified, data-bearing differential signal is then integrated (e.g., by integrator 112, FIG. 1) and quantized (e.g., by quantizer 116, FIG. 1) to produce a feedback signal (e.g., $V_{FB}+$ and $V_{FB}-$). It is this feedback signal that is monitored and evaluated, in blocks 902 and 904.

Thus, various embodiments of sampling modules, integration systems, sigma-delta modulators, and methods of their operation have been described. An embodiment includes an integrator system comprising a differential amplifier, a first sampling module, and a second sampling module. The differential amplifier comprises a first differential input that includes a first amplifier input terminal and a second amplifier input terminal. The first sampling module is operatively coupled to the first amplifier input terminal and to the second amplifier input terminal, and the first sampling module includes a first capacitor and a first set of switches. The first set of switches is configured to change a connection status between the first capacitor and the first and second amplifier input terminals of the differential amplifier when a change in a polarity of a differential input signal does not occur between consecutive switching cycles, and to refrain from changing the connection status between the first capacitor and the first and second amplifier input terminals when the change in the polarity of the differential input signal does occur between the consecutive switching cycles. The second sampling module is operatively coupled to the first amplifier input terminal and to the second amplifier input terminal, and the second sampling module includes a second capacitor and a second set of switches. The second set of switches is configured to change a connection status between the second capacitor and the first and second amplifier input terminals when the change in the polarity of the differential input signal does occur, and to refrain from changing the connection status between the second capacitor and the first and second amplifier input terminals when the change in the polarity of the differential input signal does not occur.

Another embodiment includes a switched-capacitor circuit comprising a first output node, a second output node, a first sampling module, and a second sampling module. The first sampling module is coupled to the first and second output nodes, and the first sampling module includes a first capacitor, a first switch, and a second switch. The first switch is adapted to connect the first capacitor to the first output node when a first switching signal or when a second switching signal is asserted, and the second switch is adapted to connect the first capacitor to the second output node when a third switching signal or when a fourth switching signal is asserted. The second sampling module is coupled to the first and second output nodes, and the second sampling module includes a second capacitor, a third switch, and a fourth switch. The third switch is adapted to connect the second capacitor to the first output node when the first switching signal or when the fourth switching signal is asserted, and the fourth switch is adapted to connect the second capacitor to the second output node when the second switching signal or when the third switching signal is asserted.

Yet another embodiment includes a method performed in an integration system that includes a switched-capacitor feedback circuit coupled to a differential input of a differential amplifier. The method comprises, during each of a plurality of switching cycles, monitoring a first differential signal to determine a polarity of the first differential signal, the polarity of the first differential signal capable of being positive or negative. The method also comprises, in response to the polarity of the first differential signal changing between positive and negative, refraining from causing a first sampling module of the switched-capacitor feedback circuit to change a connection status between a first capacitor of the first sampling module and the differential input of the differential amplifier, and causing a second sampling module of the switched-capacitor feedback circuit to change a connection status between a second capacitor of the second sampling module and the differential input of the differential amplifier. The method also comprises, in response to the polarity of the first differential signal remaining positive or negative, and not changing between consecutive switching cycles, causing the first sampling module to change the connection status between the first capacitor and the differential input, and refraining from causing the second sampling module to change the connection status between the second capacitor and the differential input.

While the principles of the inventive subject matter have been described above in connection with specific systems, apparatus, and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, various adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:
1. An integrator system comprising:
a differential amplifier comprising a first differential input that includes a first amplifier input terminal and a second amplifier input terminal;
a first sampling module operatively coupled to the first amplifier input terminal and to the second amplifier input terminal, wherein the first sampling module includes a first capacitor and a first set of switches, wherein the first set of switches is configured to change a connection status between the first capacitor and the first and second amplifier input terminals of the differential amplifier when a change in a polarity of a differential input signal does not occur between consecutive switching cycles, and to refrain from changing the connection status between the first capacitor and the first and second amplifier input terminals when the change in the polarity of the differential input signal does occur between the consecutive switching cycles; and
a second sampling module operatively coupled to the first amplifier input terminal and to the second amplifier input terminal, wherein the second sampling module includes a second capacitor and a second set of switches, wherein the second set of switches is configured to change a connection status between the second capacitor and the first and second amplifier input terminals when the change in the polarity of the differential input signal does occur, and to refrain from changing the connection status between the second capacitor and the first and second amplifier input terminals when the change in the polarity of the differential input signal does not occur.

2. The integrator system of claim 1, wherein the first sampling module and the second sampling module form portions of a switched-capacitor feedback circuit.

3. The integrator system of claim 1, further comprising:
an input sampling module operatively coupled to the first amplifier input terminal and to the second amplifier input terminal, and adapted to produce a differential, continuous-time input to the first amplifier input terminal and to the second amplifier input terminal.

4. The integrator system of claim 1, further comprising:
a switch control module operatively coupled with the first sampling module and with the second sampling module, and adapted to receive the differential input signal, and to provide control signals to the first set of switches and to the second set of switches to cause changes in the connection status between the first capacitor and the first and second amplifier input terminals to occur during certain switching cycles, and to cause changes in the connection status between the second capacitor and the first and second amplifier input terminals to occur during other switching cycles.

5. The integrator system of claim 1, wherein:
the first set of switches of the first sampling module includes a first switch and a second switch coupled to the first capacitor, wherein the first switch is adapted to connect the first capacitor to the first amplifier input terminal when a first switching signal or when a second switching signal is asserted, and wherein the second switch is adapted to connect the first capacitor to the second amplifier input terminal when a third switching signal or when a fourth switching signal is asserted; and
the second set of switches of the second sampling module include a third switch and a fourth switch coupled to the second capacitor, wherein the third switch is adapted to connect the second capacitor to the first amplifier input terminal when the first switching signal or when the fourth switching signal is asserted, and wherein the fourth switch is adapted to connect the second capacitor to the second amplifier input terminal when the second switching signal or when the third switching signal is asserted.

6. The integrator system of claim 5, wherein:
the first sampling module further includes a first input and a second input, and the first set of switches further includes a fifth switch and a sixth switch coupled to the first capacitor, wherein the fifth switch is adapted to connect the first capacitor to the first input when a fifth switching signal is asserted, and wherein the sixth switch is adapted to connect the first capacitor to the second input when a sixth switching signal is asserted; and
wherein the second set of switches further includes a seventh switch and an eighth switch coupled to the second capacitor, wherein the seventh switch is adapted to connect the second capacitor to a reference voltage when the fifth switching signal is asserted, and wherein the eighth switch is adapted to connect the second capacitor to the reference voltage when the sixth switching signal is asserted.

7. The integrator system of claim 5, wherein:
the first sampling module further includes a third capacitor, and the first set of switches further includes a fifth switch and a sixth switch coupled to the third capacitor, wherein the fifth switch is adapted to connect the third capacitor to the first amplifier input terminal when the third switching signal or when the fourth switching signal is asserted, and wherein the sixth switch is adapted to connect the third capacitor to the second amplifier input terminal when the first switching signal or when the second switching signal is asserted; and
wherein the second sampling module further includes a fourth capacitor, and the second set of switches further includes a seventh switch and an eighth switch coupled to the fourth capacitor, wherein the seventh switch is adapted to connect the fourth capacitor to the first amplifier input terminal when the second switching signal or when the third switching signal is asserted, and wherein the eighth switch is adapted to connect the fourth capacitor to the second amplifier input terminal when the first switching signal or when the fourth switching signal is asserted.

8. The integrator system of claim 7, wherein:
the first sampling module further includes a first input and a second input, and the first set of switches further includes a ninth switch, a tenth switch, an eleventh switch, and a twelfth switch, wherein the ninth switch is adapted to connect the first capacitor to the first input when a fifth switching signal is asserted, and wherein the tenth switch is adapted to connect the first capacitor to the second input when a sixth switching signal is asserted, and wherein the eleventh switch is adapted to connect the third capacitor to the first input when the sixth switching signal is asserted, and wherein the twelfth switch is adapted to connect the third capacitor to the second input when the fifth switching signal is asserted.

9. The integrator system of claim 8, wherein:
the second set of switches further includes a thirteenth switch, a fourteenth switch, a fifteenth switch, and a sixteenth switch, wherein the thirteenth switch is adapted to connect the second capacitor to a reference voltage when the fifth switching signal is asserted, and wherein the fourteenth switch is adapted to connect the second capacitor to the reference voltage when the sixth switching signal is asserted, and wherein the fifteenth switch is adapted to connect the fourth capacitor to the reference voltage when the sixth switching signal is asserted, and wherein the sixteenth switch is adapted to connect the fourth capacitor to the reference voltage when the fifth switching signal is asserted.

10. The integrator system of claim 9, further comprising:
a switch control module operatively coupled with the first sampling module and with the second sampling module, and adapted to provide the first switching signal, the second switching signal, the third switching signal, the fourth switching signal, the fifth switching signal, and the sixth switching signal.

11. The integrator system of claim 8, wherein the second capacitor is connected to a reference voltage, and wherein the fourth capacitor is connected to a reference voltage.

12. A switched-capacitor circuit comprising:
a first output node;
a second output node;
a first sampling module coupled to the first and second output nodes, wherein the first sampling module includes a first capacitor, a first switch, and a second switch, wherein the first switch is adapted to connect the first capacitor to the first output node when a first switching signal or when a second switching signal is asserted, and wherein the second switch is adapted to connect the first capacitor to the second output node when a third switching signal or when a fourth switching signal is asserted, and wherein the first switch and the second switch are configured to change a connection status between the first capacitor and the first and second output nodes when a change in a polarity of a differential input signal does not occur between consecutive switching cycles, and to refrain from changing the connection status between the first capacitor and the first and second output nodes when the change in the polarity of the differential input signal does occur between the consecutive switching cycles; and
a second sampling module coupled to the first and second output nodes, wherein the second sampling module includes a second capacitor, a third switch, and a fourth switch, wherein the third switch is adapted to connect the second capacitor to the first output node when the first switching signal or when the fourth switching signal is asserted, and wherein the fourth switch is adapted to connect the second capacitor to the second output node when the second switching signal or when the third switching signal is asserted, wherein the third switch and the fourth switch are configured to change a connection status between the second capacitor and the first and second output nodes when the change in the polarity of the differential input signal does occur, and to refrain from changing the connection status between the second capacitor and the first and second output nodes when the change in the polarity of the differential input signal does not occur.

13. A switched-capacitor circuit comprising:
a first output node;
a second output node;
a first sampling module coupled to the first and second output nodes, wherein the first sampling module includes a first capacitor, a first switch, and a second switch, wherein the first switch is adapted to connect the first capacitor to the first output node when a first switching signal or when a second switching signal is asserted, and wherein the second switch is adapted to connect the first capacitor to the second output node when a third switching signal or when a fourth switching signal is asserted; and
a second sampling module coupled to the first and second output nodes, wherein the second sampling module includes a second capacitor, a third switch, and a fourth switch, wherein the third switch is adapted to connect the second capacitor to the first output node when the first switching signal or when the fourth switching signal is asserted, and wherein the fourth switch is adapted to connect the second capacitor to the second output node when the second switching signal or when the third switching signal is asserted, wherein
the first sampling module further includes a first input, a second input, a fifth switch, and a sixth switch, wherein the fifth switch is adapted to connect the first capacitor to the first input when a fifth switching signal is asserted, and wherein the sixth switch is adapted to connect the first capacitor to the second input when a sixth switching signal is asserted; and
wherein the second sampling module further includes a seventh switch and an eighth switch, wherein the seventh switch is adapted to connect the second capacitor to a reference voltage when the fifth switching signal is asserted, and wherein the eighth switch is adapted to connect the second capacitor to the reference voltage when the sixth switching signal is asserted.

14. A switched-capacitor circuit comprising:
a first output node;
a second output node;
a first sampling module coupled to the first and second output nodes, wherein the first sampling module includes a first capacitor, a first switch, and a second switch, wherein the first switch is adapted to connect the first capacitor to the first output node when a first switching signal or when a second switching signal is asserted, and wherein the second switch is adapted to connect the first capacitor to the second output node when a third switching signal or when a fourth switching signal is asserted; and
a second sampling module coupled to the first and second output nodes, wherein the second sampling module includes a second capacitor, a third switch, and a fourth switch, wherein the third switch is adapted to connect the second capacitor to the first output node when the first switching signal or when the fourth switching signal is asserted, and wherein the fourth switch is adapted to connect the second capacitor to the second output node when the second switching signal or when the third switching signal is asserted, wherein
the first sampling module further includes a third capacitor, and the first set of switches further includes a fifth switch and a sixth switch coupled to the third capacitor, wherein the fifth switch is adapted to connect the third capacitor to the first output node when the third switching signal or when the fourth switching signal is asserted, and wherein the sixth switch is adapted to connect the third capacitor to the second output node when the first switching signal or when the second switching signal is asserted; and
wherein the second sampling module further includes a fourth capacitor, and the second set of switches further includes a seventh switch and an eighth switch coupled to the fourth capacitor, wherein the seventh switch is adapted to connect the fourth capacitor to the first output node when the second switching signal or when the third switching signal is asserted, and wherein the eighth switch is adapted to connect the fourth capacitor to the second output node when the first switching signal or when the fourth switching signal is asserted.

15. The circuit of claim 14, wherein:
the first sampling module further includes a first input and a second input, and the first set of switches further includes a ninth switch, a tenth switch, an eleventh switch, and a twelfth switch, wherein the ninth switch is adapted to connect the first capacitor to the first input when a fifth switching signal is asserted, and wherein the tenth switch is adapted to connect the first capacitor to the second input when a sixth switching signal is asserted, and wherein the eleventh switch is adapted to connect the third capacitor to the first input when the sixth switching signal is asserted, and wherein the twelfth switch is adapted to connect the third capacitor to the second input when the fifth switching signal is asserted.

16. The circuit of claim 15, wherein:
the second set of switches further includes a thirteenth switch, a fourteenth switch, a fifteenth switch, and a sixteenth switch, wherein the thirteenth switch is adapted to connect the second capacitor to a reference voltage when the fifth switching signal is asserted, and wherein the fourteenth switch is adapted to connect the second capacitor to the reference voltage when the sixth switching signal is asserted, and wherein the fifteenth switch is adapted to connect the fourth capacitor to the reference voltage when the sixth switching signal is asserted, and wherein the sixteenth switch is adapted to connect the fourth capacitor to the reference voltage when the fifth switching signal is asserted.

17. The integrator system of claim 14, wherein the second capacitor is connected to a reference voltage, and wherein the fourth capacitor is connected to a reference voltage.

18. A method performed in an integration system that includes a switched-capacitor feedback circuit coupled to a differential input of a differential amplifier, the method comprising:
during each of a plurality of switching cycles, monitoring a first differential signal to determine a polarity of the first differential signal, the polarity of the first differential signal capable of being positive or negative;
in response to the polarity of the first differential signal changing between positive and negative, refraining from causing a first sampling module of the switched-capacitor feedback circuit to change a connection status between a first capacitor of the first sampling module and the differential input of the differential amplifier, and causing a second sampling module of the switched-capacitor feedback circuit to change a connection status between a second capacitor of the second sampling module and the differential input of the differential amplifier; and
in response to the polarity of the first differential signal remaining positive or negative, and not changing between consecutive switching cycles, causing the first sampling module to change the connection status between the first capacitor and the differential input, and refraining from causing the second sampling module to change the connection status between the second capacitor and the differential input.

19. The method of claim 18, wherein the first sampling module includes a first switch and a second switch coupled to the first capacitor, and wherein causing the first sampling module to change the connection status comprises:
providing a switching signal adapted to cause the first switch to change its state of being opened or closed; and
providing a switching signal adapted to cause the second switch to change its state of being opened or closed.

20. The method of claim 19, wherein the second sampling module includes a third switch and a fourth switch, and wherein causing the second sampling module to change the connection status comprises:
providing a switching signal adapted to cause the third switch to change its state of being opened or closed; and
providing a switching signal adapted to cause the fourth switch to change its state of being opened or closed.

21. The method of claim 20, wherein the first sampling module includes a first input, a second input, a fifth switch and a sixth switch, and the method further comprises:
at certain times, providing a switching signal adapted to cause the fifth switch to close, thus connecting the first input with the first capacitor; and
at other times, providing a switching signal adapted to cause the sixth switch to close, thus connecting the second input with the first capacitor.

22. The method of claim 21, wherein the second sampling module includes a connection to a reference voltage, a seventh switch, and an eighth switch, and the method further comprises:
at certain times, providing a switching signal adapted to cause the seventh switch to close, thus connecting the reference voltage with the second capacitor; and
at other times, providing a switching signal adapted to cause the eighth eight switch to close, thus connecting the reference voltage with the second capacitor.

23. The method of claim 22, wherein the differential amplifier further includes a differential output, and the method further comprises:
integrating a difference between signals present at the differential input to produce a second differential signal at the differential output.

24. The method of claim 23, further comprising:
summing the second differential signal with a third, data-bearing differential signal to produce a modified, data-bearing differential signal; and
integrating and quantizing the modified, data-bearing differential signal to produce the first differential signal.

* * * * *